United States Patent
Cho et al.

[11] Patent Number: 5,897,359
[45] Date of Patent: Apr. 27, 1999

[54] METHOD OF MANUFACTURING A SILICON/SILICON GERMANIUM HETEROJUNCTION BIPOLAR TRANSISTOR

[75] Inventors: Deok Ho Cho; Soo Min Lee; Tae Hyeon Han; Byung Ryul Ryum; Kwang Eui Pyun, all of Daejon-shi, Rep. of Korea

[73] Assignee: Electronics and Telecommunications Research Institute, Daejon-shi, Rep. of Korea

[21] Appl. No.: 08/987,474

[22] Filed: Dec. 9, 1997

[30] Foreign Application Priority Data

Dec. 9, 1996 [KR] Rep. of Korea ............. 96-63185

[51] Int. Cl.[6] ............. H01L 21/331; H01L 21/8222
[52] U.S. Cl. ............. 438/312
[58] Field of Search ............. 438/312, 318, 438/366, 313, 314, 315, 316, 317, 319, 320, 321; 428/319

[56] References Cited

U.S. PATENT DOCUMENTS 5,340,753  8/1994  Bassous et al. ............. 438/366
5,432,104  7/1995  Sato .
5,583,059  12/1996  Burghartz ............. 438/319
5,696,007  12/1997  Ryum et al. ............. 438/318

*Primary Examiner*—Charles Bowers
*Assistant Examiner*—Craig Thompson
*Attorney, Agent, or Firm*—Jacobson, Price, Holman & Stern, PLLC

[57] ABSTRACT

There is disclosed a method of manufacturing a silicon/silicon germanium heterojunction bipolar transistor having a good conformity and an improved speed characteristic, which includes the steps of sequentially laminating an underlying nitride film, an oxide film, a polycrystalline silicon film and an upper nitride on a semiconductor substrate on which devices are separated and a collector is formed; sequentially etching said upper nitride film and said polycrystalline silicon film using the emitter as a mask, and then forming a side wall nitride film; selectively wet-etching said oxide film to form a side base linker opening; burying said base linker opening with a polycrystalline silicon; oxidizing said polycrystalline silicon film buried into said base linker opening and then removing said oxide film by means of the selective wet-etch process; removing said upper nitride and then forming a silicon/silicon germanium film as a base film on the exposed thereof; and forming an emitter said silicon/silicon germanium film.

10 Claims, 4 Drawing Sheets

METHOD OF MANUFACTURING A SILICON/SILICON GERMANIUM HETEROJUNCTION BIPOLAR TRANSISTOR

BACKGROUND OF THE INVENTION

1. Field of the Invention

The present invention relates to a method of manufacturing a silicon/silicon germanium heterojunction bipolar transistor. In particular, the present invention relates to a method of manufacturing a silicon/silicon germanium heterojunction bipolar transistor which can be used without limitation in thickness of a thin silicon/silicon germanium film used as a base film to self-align a base and a collector and is also not affected by the size and density of its pattern.

2. Description of the Prior Art

Recently, an attempt to improve performance of a heterojunction bipolar transistor has been actively made by giving a least process change in the silicon manufacture process now being used widely, instead of making the device and the circuit itself using a compound semiconductor. A typical one of them is a silicon/silicon germanium heterojunction bipolar transistor.

In FIG. 1, there is shown a cross sectional view of SSSB (Super Self-aligned Selectively grown Base) transistor fabricated by using silicon/silicon germanium as a base film, disclosed, in 1990, in IEDM by NEC. In order to make the silicon/silicon germanium heterojunction bipolar transistor having the above-mentioned structure, a $N^+$ buried layer 2 is formed on a $P^-$ silicon substrate 1, and then a $N^-$ epitaxial layer 3 is formed on the $N^+$ buried layer 2. Thereafter, after a device separation is performed, an oxide film 4, a $P^+$ polysilicon silicon film 5 and an insulating film 6 are sequentially formed on the $N^-$ epitaxial layer 3. Then, the insulating film 6 and the $P^+$ polysilicon silicon film 5 are sequentially etched by using emitter as a mask. Next, first side-wall insulating films 7 are formed through the insulating film deposition and etch-back method. The exposed portion of the oxide film 4 is wet-etched by using the insulating film 6 and the first side-wall insulating films 7 as an etching mask. At this time, the oxide film 4 is laterally etched by isotropic etch.

Thereafter, a silicon/silicon germanium film 8 is formed as a base film using the selective epitaxial growth method, second side-wall insulating films 9 are formed by the insulator deposition and etch-back method, and then a $N^+$ polysilicon silicon film 10 is formed as an emitter electrode by means of the selective epitaxial growth method, thereby completing a SSSB transistor using the silicon/silicon germanium film 8 as a base film.

In FIG. 1, a reference numeral 8-1 indicates a base linker.

In case that the silicon/silicon germanium heterojunction bipolar transistor is manufactured by the above-mentioned method, assuming that the growth rate of the silicon/silicon germanium film 8 is the same in the $N^-$ epitaxial layer 3 and the $P^+$ polysilicon silicon film 5 when the silicon/silicon germanium film 8 is formed as a base film by means of the selective epitaxial growth method, there occurs a problem that the thickness of the silicon/silicon germanium film 8 used as a base film must be more than one half of the oxide film 4 in thickness. In addition, since the base linker opening must be buried by means of the selective epitaxial growth method, there is a disadvantage that device performance uniformity is degraded within the wafer due to a loading phenomenon caused by the difference in the size and density of the pattern thereof.

FIG. 2 shows a structure of the heterojunction bipolar transistor disclosed in IDEM by Siemens AG 1995, in which it has the same problem as shown in FIG. 1 because the process of forming the silicon/silicon germanium film 16 is same with the process shown in FIG. 1. In addition, since the $N^+$ epitaxial layer 11 is shaped like an island on a substrate and thus the step coverage becomes degraded in the subsequent process step 5, there occurs is a problem in forming multilevel interconnections thereon and also a limitation that the width W must be less than the width T in case that the oxide film 12 is etched along the side by means of selective wet etching, as shown in FIG. 2. Also, since the $N^-$ epitaxial layer 11 must be increased in thickness so as to make the collector-emitter breakdown voltage high, there is a disadvantage that the step coverage becomes further degraded, and the use of the device is thus limited to a low voltage device.

In FIG. 2, the reference numerals 13, 14, 15, 16-1, 17, and 18 indicate a $P^+$ polycrystalline silicon, an oxide film, a first side wall insulating film, a base linker, a second side wall insulating film, and an $N^+$ polycrystalline silicon, respectively.

SUMMARY OF THE INVENTION

Accordingly, it is an object of the present invention to solve the problems involved in the prior art, and to provide a process method applicable to an integrated circuit which is not limited in thickness of a thin silicon/silicon germanium film used as a base film and is also not affected by the size and density of its pattern.

To achieve the above object, the method of manufacturing a silicon/silicon germanium heterojunction bipolar transistor comprises the steps of sequentially forming a first insulating film, a second insulating film, a first conductive layer, and a third insulating film on a semiconductor substrate on which devices are isolated and a collector is formed; sequentially etching said third insulating film and said first conductive layer using an emitter-opening mask, and then forming a first side wall insulating film on the etched surface thereof; wet-etching the exposed portion of said second insulating film, thereby to form a base linker opening; forming a second conductive layer on the entire structure in which said base linker opening is formed, thereby to bury said base linker opening with said second conductive layer; oxidizing said second conductive layer to form an oxide film, with the portion of said second conductive layer buried into the base linker opening being unoxidized; removing said oxide film, thereby to form a base linker as the second conductive layer remained at said base linker opening; removing said first insulating film exposed by means of the base linker formation process; forming a silicon/silicon germanium film as a base film on the exposed surfaces of said base linker and said semiconductor substrate, thereby to form a base; forming a second side wall insulating film so as to cover said first side wall insulating film, and then forming an emitter as a third conductive layer on said silicon/silicon germanium film; and depositing a fourth insulating film, forming contact holes, and then forming metal interconnections.

BRIEF DESCRIPTION OF THE DRAWINGS

For fuller understanding of the nature and object of the invention, reference should be done according to the following detailed description taken in conjunction with the accompanying drawings in which.

DETAILED DESCRIPTION OF PREFERRED EMBODIMENT

FIGS. 3A through 3G show processes for sequentially manufacturing a silicon/silicon germanium heterojunction bipolar transistor according to the present invention.

Figure 1:
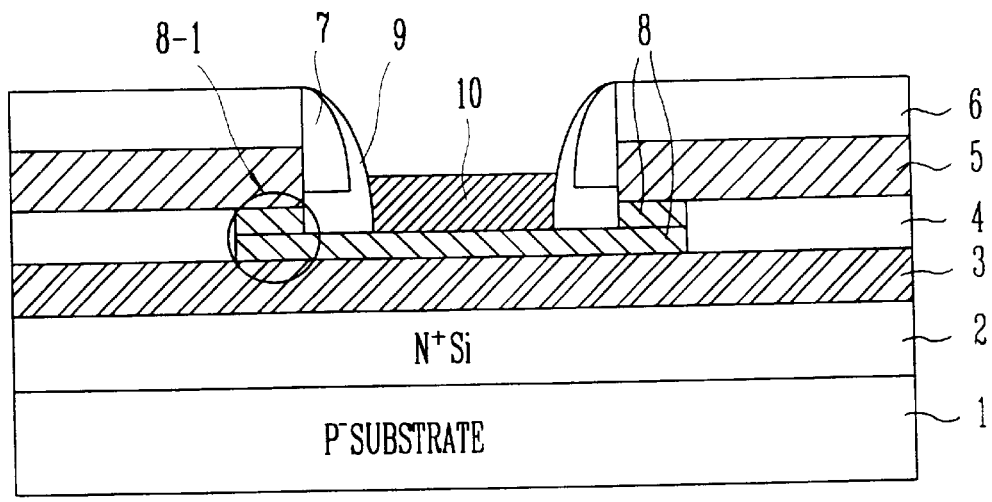
FIG. 1 and FIG. 2 are cross-sectional views of a heterojunction bipolar transistor structure according to a prior art.
Figure 2:
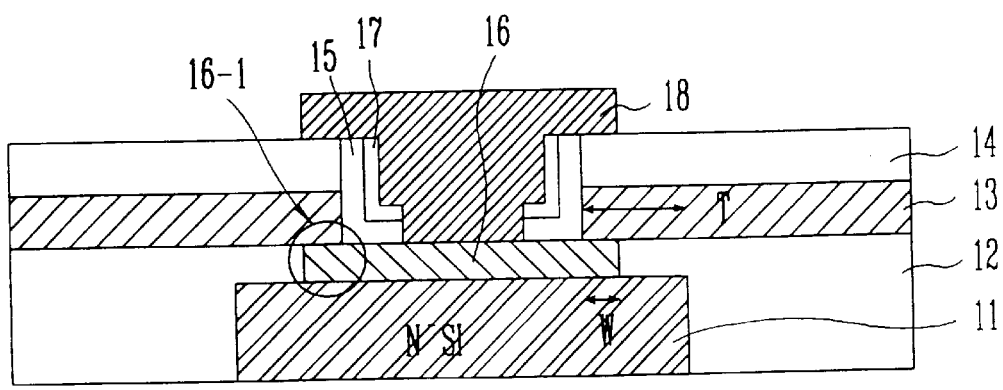
Figure 3A:
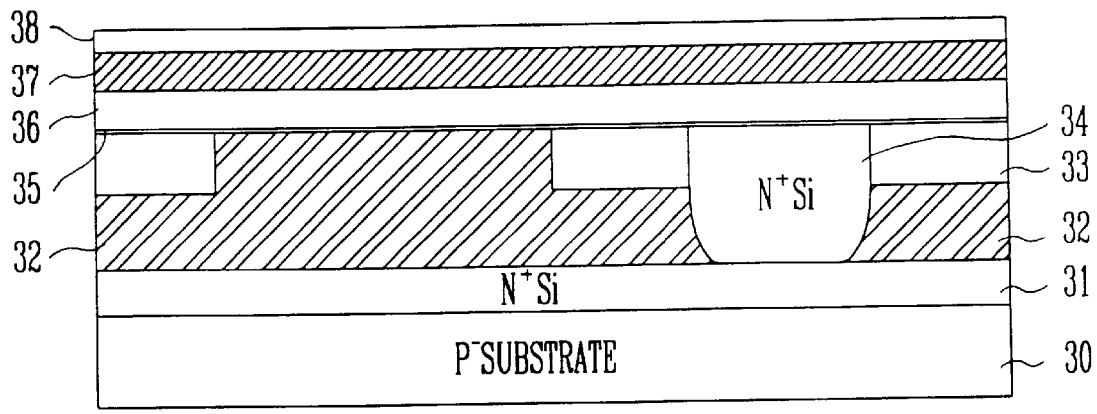
FIGS. 3A through 3G show processes for sequentially manufacturing a silicon/silicon germanium heterojunction bipolar transistor according to the present invention.

First, as illustrated in FIG. 3A, a $N^+$ buried layer 31 is formed on a $P^-$ silicon substrate 30, and then a $N^-$ epitaxial layer 32 is formed on the $N^+$ buried layer 31. Thereafter, a $N^+$ sinker 34 is formed in the selected portion of the $N^-$ epitaxial layer 32 as a collector, and then an oxide film 33 is formed on the selected portions of the $N^-$ epitaxial layer 32. Next, a first insulating film 35, a second insulating film 36, a first conductive layer 37, and a third insulating film 38 are sequentially formed on the semiconductor substrate formed as a result of the above mentioned processes by using a chemical vapor deposition equipment.

In the above process, the first insulating film 35 of nitride is formed in a thickness of 5–100 nm, the second insulating film 36 of oxide is formed in a thickness of 10–500 nm, the first conductive layer 37 of $P^+$ polycrystalline silicon is formed in a thickness of about 200 nm, the third insulating film 38 of nitride is formed in a thickness of 10–500 nm. Also, the first conductive layer is doped with boron in concentration of $10^{18}$–$10^{21}/cm^3$.

Figure 3B:
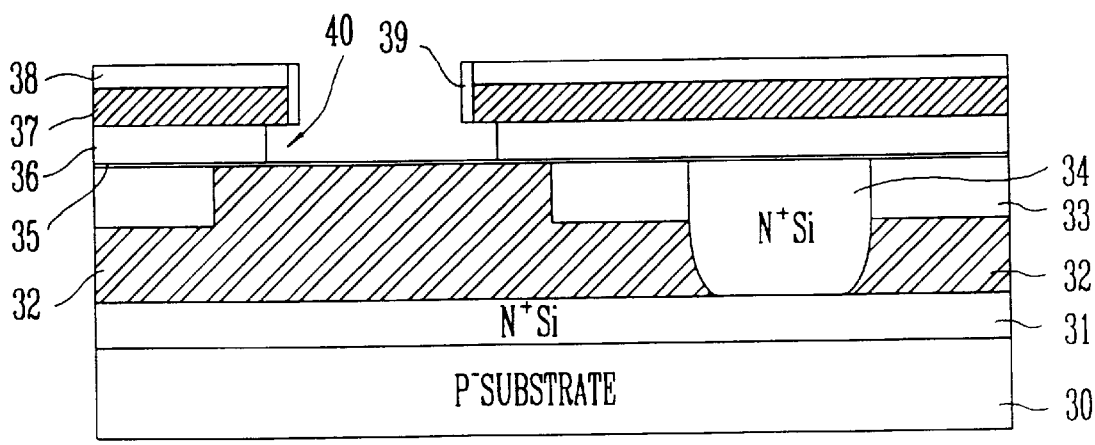

Referring now to FIG. 3B, after the third insulating film 38 and the first conductive layer 37 are consecutively etched using an emitter-opening mask, first side wall insulating film 39 are formed on the etched surfaces, and then the exposed portion of the second insulating film 36 is laterally wet-etched using the third insulating film 38 and the first side wall insulating films 39 as etching masks.

In the above, the second insulating film 36 is laterally etched in the wet-etching process to form a base linker opening 40. At this time, the first side wall insulating film 39 is formed using the nitride deposition and etch-back process.

Figure 3C:
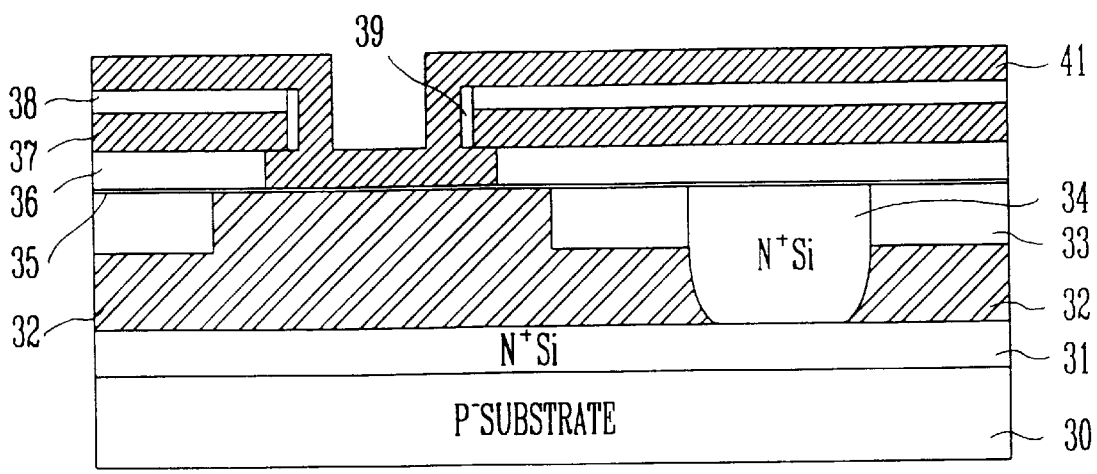

Next, as shown in FIG. 3C, a second conductive layer 41 is formed in the structure in which the base linker opening 40 is formed. At this time, the second conductive layer 41 is formed using $P^+$ polycrystalline silicon having a good conformality, and thus the base linker opening 40 is completely buried with the second conductive layer 41. Also, the second conductive layer 41 is doped with boron in concentration of $10^{18}$–$10^{21}/cm^3$.

Figure 3D:
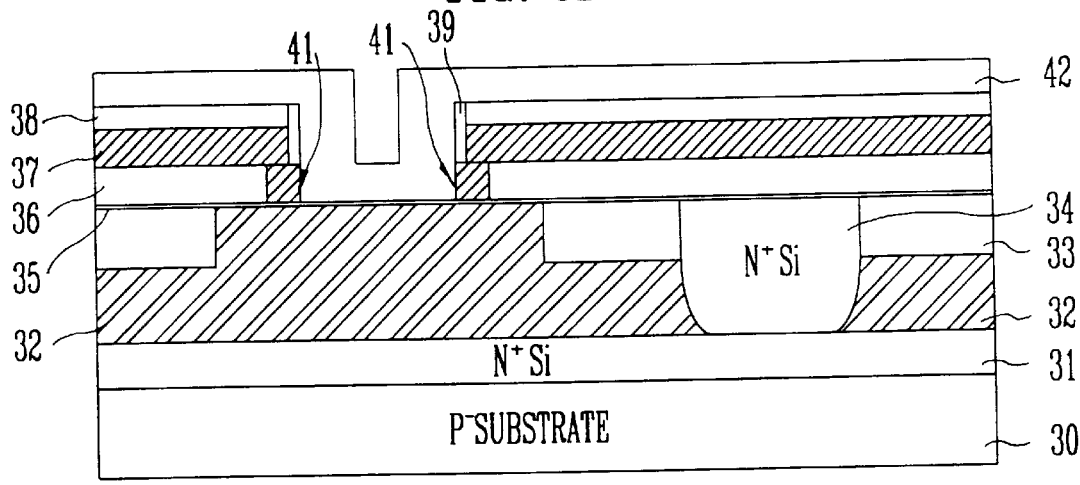

Thereafter, as shown in FIG. 3D, the exposed portion of the second conductive layer 41 is oxidized by the thermal oxidization process to form an oxide film 42 thereon. At this time, the second conductive layer 41 in the base linker opening 40 is remained unoxidized.

In the above process, when the exposed portion of the second conductive layer 41 is thermally oxidized by the thermal oxidization process, the first insulating film 35 serves to protect the surface of the $N^-$ epitaxial layer 32. If the first insulating film 35 formed of nitride does not exist therein, when the second conductive layer 41 formed of $P^+$ polycrystalline silicon is thermally oxidized, the morphology of grain boundary of the second conductive layer 41 is transferred to the single crystalline $N^-$ epitaxial layer 32, thereby making the surface thereof rough and making difficult to grow a thin silicon/silicon germanium film to be used as a base film in the subsequent process (FIG. 4F).

Figure 3E:
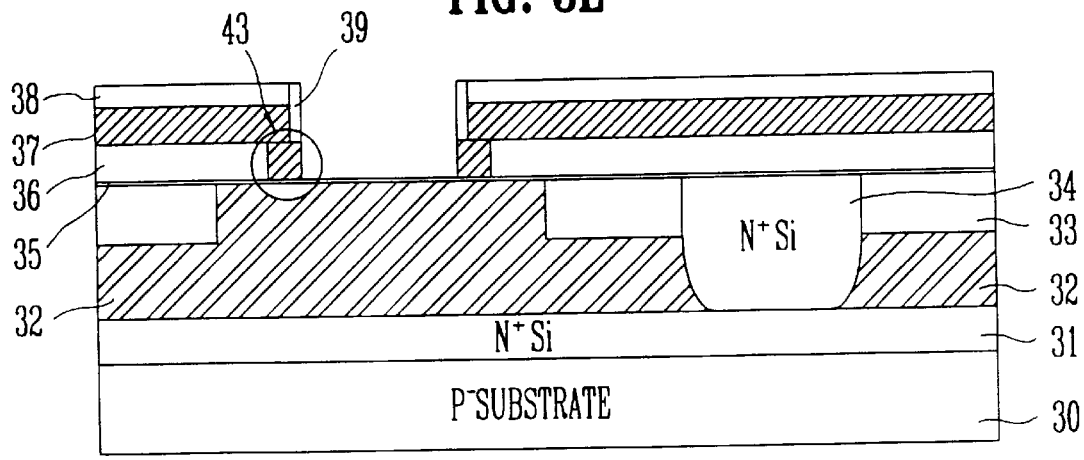

Next, in FIG. 3E, the oxide film 42 is removed by the wet etching process. At this time, the second conductive layer 41 remained in the base linker opening 40 automatically become base linker 43.

Figure 3F:
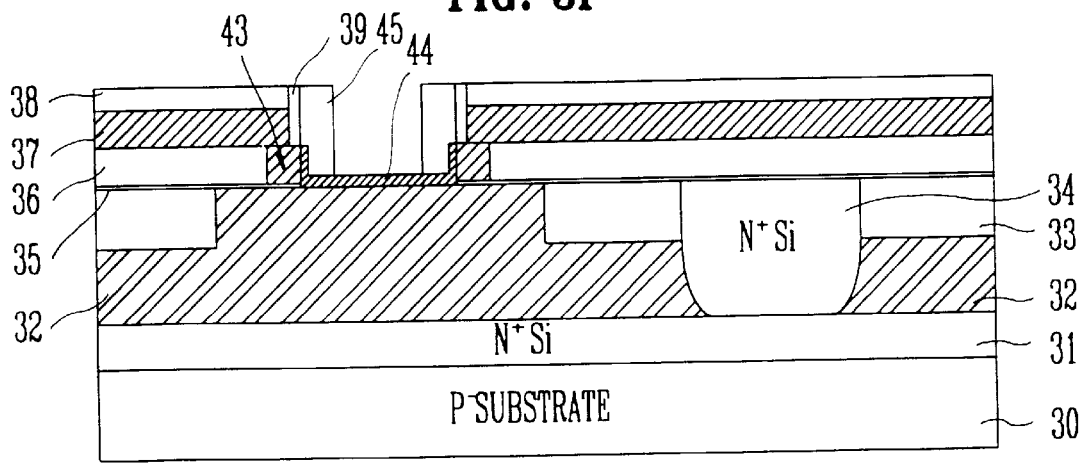

Thereafter, as shown in FIG. 3F, after the first insulating film 35 exposed by the base linker 43 formation process is removed, a silicon/silicon germanium film 44 is formed on the exposed surfaces of the base linker 43 and the $N^-$ epitaxial layer 32, and then second side wall insulating film 45 is formed so as to protect the emitter and the base from shorting each other.

In the above process, the second side wall insulating film 45 is formed by oxide deposition and etch-back process.

Figure 3G:
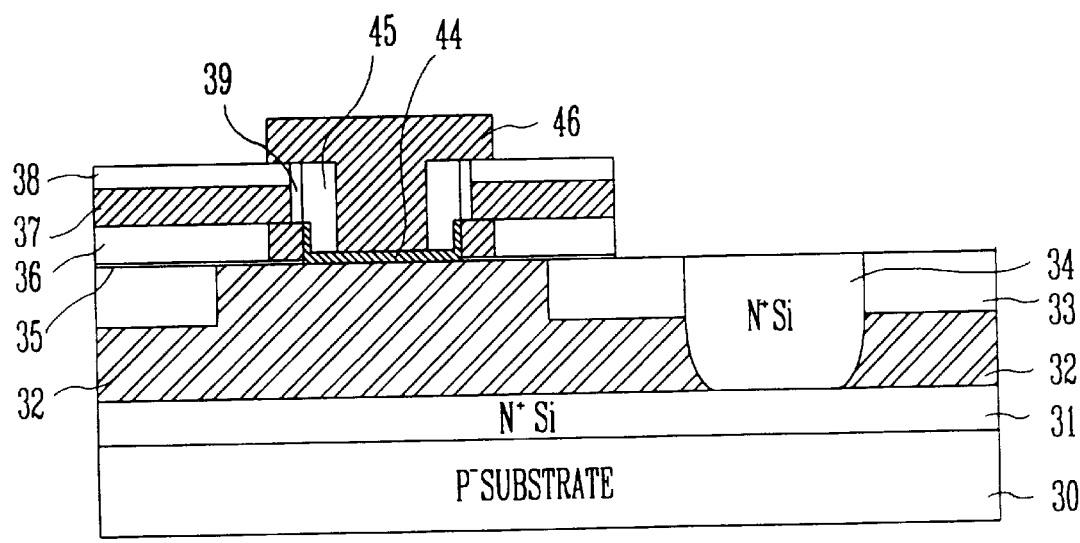

Next, as in FIG. 3G, a third conductive layer 46 as an emitter is formed on the silicon/silicon germanium film 44 and then the third insulating film 38, the first conductive layer 37, the fourth insulating film 36 and the first insulating film 35, all of which are positioned on the upper portion of the $N^+$ sinker 34, sequentially etched using a collector mask, thereby to form a collector electrode. At this time, the third conductive layer 46 is formed by $N^+$ polycrystalline silicon.

Thereafter, using the well known process as a final process after a fourth insulating film (not shown) is deposited on the entire structure thereof contact hole (now shown) formation and metal interconnection processes are followed, thereby completing the process of manufacturing the silicon/silicon germanium heterojunction bipolar transistor.

As described above, according to the present invention, when a base linker is formed by means of the selective epitaxial growth method in the conventional art, there is a disadvantage that the thickness of the silicon/silicon germanium film used as a base film is limited by the thickness of the deposited oxide film, the present invention has, however, an advantage that when the silicon/silicon germanium film is formed, the thickness of the silicon/silicon germanium used as a base film is not limited by it since it is grown toward the upper portion of the $N^-$ epitaxial layer and along the side of the base linker differently from the conventional art. In addition, there are disadvantages that the base linker must be completely buried so that the silicon/silicon germanium film and the $P^+$ polycrystalline silicon should contact each other when the silicon/silicon germanium film is formed in the conventional art and also the uniformity within a wafer is degraded since the base linker must be buried by means of the selective epitaxial growth method, the present invention has, however, advantages that the conformity becomes good and electrical characteristics of the device within a wafer becomes uniform since $P^+$ polycrystalline silicon having a good conformity is used to form a base linker, thereby being applicable to an integrated circuit for mass production.

While the present invention has been described and illustrated herein with reference to the preferred embodiment thereof, it will be understood by those skilled in the art that various changes in form and details may be made therein without departing from the spirit and scope of the invention.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method of manufacturing a silicon/silicon germanium heterojunction bipolar transistor, comprising the steps of:

sequentially forming a first insulating film, a second insulating film, a first conductive layer, and a third insulating film on a semiconductor substrate on which devices are isolated and a collector is formed;

sequentially etching said third insulating film and said first conductive layer using an emitter-opening mask, and then forming a first side wall insulating film on the etched surface thereof;

wet-etching the exposed portion of said second insulating film, thereby forming a base linker opening;

forming a second conductive layer on the entire structure in which said base linker opening is formed, thereby burying said base linker opening with said second conductive layer;

oxidizing said second conductive layer to form an oxide film, with the portion of said second conductive layer buried into the base linker opening being unoxidized;

removing said oxide film, thereby forming a base linker as the second conductive layer remained at said base linker opening;

removing said first insulating film exposed by means of the base linker formation process;

forming a silicon/silicon germanium film as a base film on the exposed surfaces of said base linker and said semiconductor substrate, thereby forming a base;

forming a second side wall insulating film so as to cover said first side wall insulating film, and then forming an emitter as a third conductive layer on said silicon/silicon germanium film; and depositing a fourth insulating film, forming contact holes, and then performing a metal interconnections.

2. A method of manufacturing a silicon/silicon germanium heterojunction bipolar transistor as claimed in claim 1, wherein said first insulating film and said third insulating film are formed of nitride.

3. A method of manufacturing a silicon/silicon germanium heterojunction bipolar transistor as claimed in claim 1, wherein said first insulating film is formed of a thickness of 5 nm–100 nm, and said third insulating film is formed of a thickness of 100 nm–500 nm.

4. A method of manufacturing a silicon/silicon germanium heterojunction bipolar transistor as claimed in claim 1, wherein said second insulating film is formed of oxide.

5. A method of manufacturing a silicon/silicon germanium heterojunction bipolar transistor as claimed in claim 1, wherein said second insulating film is formed of a thickness of 10 nm–500 nm.

6. A method of manufacturing a silicon/silicon germanium heterojunction bipolar transistor as claimed in claim 1, wherein said first conductive layer and said second conductive layer are $P^+$ crystalline silicon.

7. A method of manufacturing a silicon/silicon germanium heterojunction bipolar transistor as claimed in claim 1, wherein said third conductive layer is formed of $N^+$ polycrystalline silicon.

8. A method of manufacturing a silicon/silicon germanium heterojunction bipolar transistor as claimed in claim 1, wherein said first conductive layer and said second conductive layer are doped with boron in concentration of $10^{18}$–$10^{21}$/cm$^3$.

9. A method of manufacturing a silicon/silicon germanium heterojunction bipolar transistor as claimed in claim 1, wherein said first side wall insulating film is formed of nitride and said second side wall insulating film are formed of oxide.

10. A method of manufacturing a silicon/silicon germanium heterojunction bipolar transistor as claimed in claim 1, wherein said collector is doped in concentration of $10^{18}$–$10^{21}$/cm$^3$.

* * * * *